(12) United States Patent
Takamine

(10) Patent No.: US 10,158,342 B1
(45) Date of Patent: Dec. 18, 2018

(54) MULTIPLEXER, TRANSMISSION DEVICE, AND RECEPTION DEVICE

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/983,129

(22) Filed: May 18, 2018

(30) Foreign Application Priority Data

Jun. 23, 2017 (JP) .................. 2017-122822

(51) Int. Cl.
| | |
|---|---|
| H04B 1/38 | (2015.01) |
| H03H 9/72 | (2006.01) |
| H01L 25/065 | (2006.01) |
| H01L 41/047 | (2006.01) |
| H01L 41/053 | (2006.01) |
| H03H 7/38 | (2006.01) |
| H03H 9/145 | (2006.01) |
| H04B 1/40 | (2015.01) |
| H03H 9/64 | (2006.01) |
| H01L 27/20 | (2006.01) |

(52) U.S. Cl.
CPC .......... *H03H 9/72* (2013.01); *H01L 25/0655* (2013.01); *H01L 41/0475* (2013.01); *H01L 41/053* (2013.01); *H03H 7/38* (2013.01); *H03H 9/14552* (2013.01); *H03H 9/6483* (2013.01); *H04B 1/40* (2013.01); *H01L 27/20* (2013.01)

(58) Field of Classification Search
CPC .... H03H 9/72; H01L 25/0655; H01L 41/0475

USPC .............................. 455/68, 71, 73
See application file for complete search history.

(56) References Cited

U.S. PATENT DOCUMENTS

| | | | | |
|---|---|---|---|---|
| 8,331,873 | B2* | 12/2012 | Shionoiri | G06K 19/0701 |
| | | | | 455/129 |
| 2003/0148739 | A1* | 8/2003 | Kosemura | H01F 17/0006 |
| | | | | 455/73 |
| 2017/0331457 | A1* | 11/2017 | Satoh | H01L 41/047 |
| 2017/0373668 | A1* | 12/2017 | Nishihara | H03H 9/6406 |
| 2018/0026605 | A1* | 1/2018 | Ito | H03H 9/145 |
| | | | | 367/135 |
| 2018/0041174 | A1* | 2/2018 | Muto | H03F 1/56 |
| 2018/0041190 | A1* | 2/2018 | Yoshimura | H03H 9/547 |

(Continued)

FOREIGN PATENT DOCUMENTS

WO 2016/208670 A1 12/2016

*Primary Examiner* — Md Talukder
(74) *Attorney, Agent, or Firm* — Keating & Bennett, LLP

(57) ABSTRACT

A multiplexer includes filters on one principal surface of a mounting substrate and having mutually different frequency bands, and an inductance element which is incorporated in the mounting substrate and one end of which is connected to one end of the filter. The other end of the inductance element and one end of each of the filters, are connected to each other at a common connection point. The inductance element is defined by spiral wiring conductors disposed in first and second wiring layers provided in an inner layer of the mounting substrate. The mounting substrate includes third and fourth wiring layers which are adjacent to the first and second wiring layers, and in which no ground pattern is provided in a portion corresponding to a formation region of the inductance element.

18 Claims, 17 Drawing Sheets

(56) References Cited

U.S. PATENT DOCUMENTS

| | | | |
|---|---|---|---|
| 2018/0041194 A1* | 2/2018 | Ito | H03H 9/25 |
| 2018/0109243 A1 | 4/2018 | Takamine | |
| 2018/0123547 A1* | 5/2018 | Kato | H03H 7/01 |
| 2018/0123556 A1* | 5/2018 | Takamine | H01L 41/1873 |

* cited by examiner

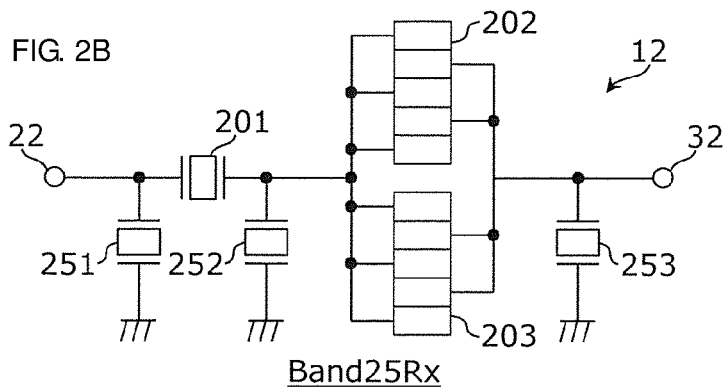
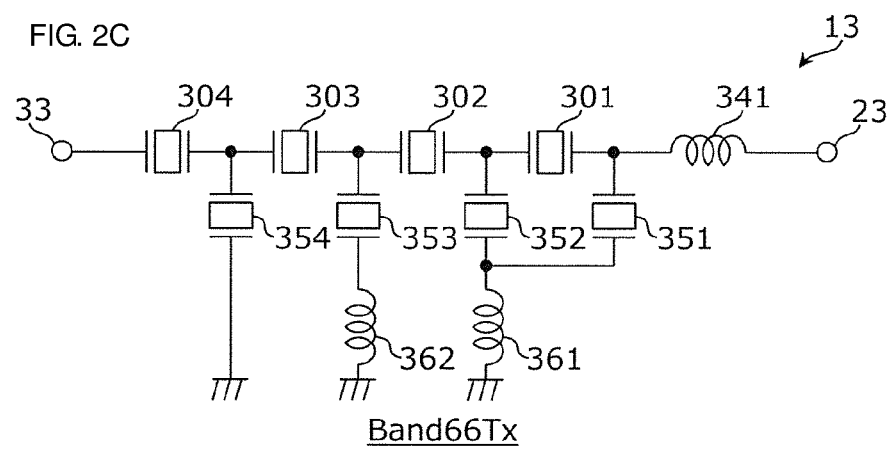
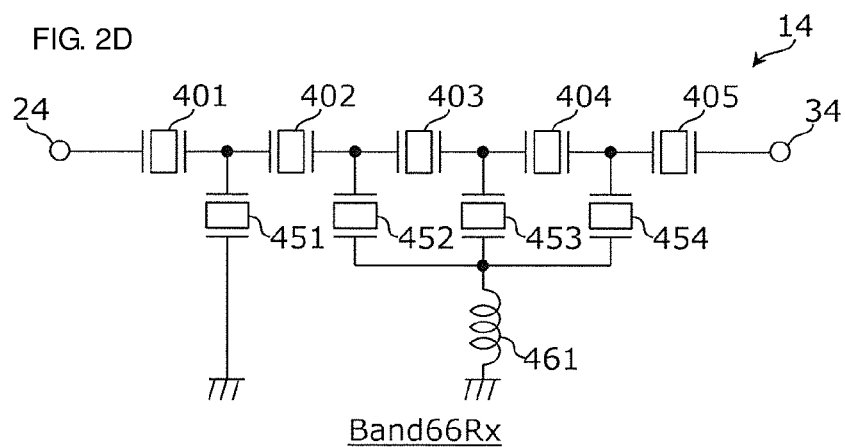

Band25Tx

Band25Rx

Band66Tx

Band66Rx

Band66Tx

Band25Tx

Band25Rx

Band66Tx

Band66Rx

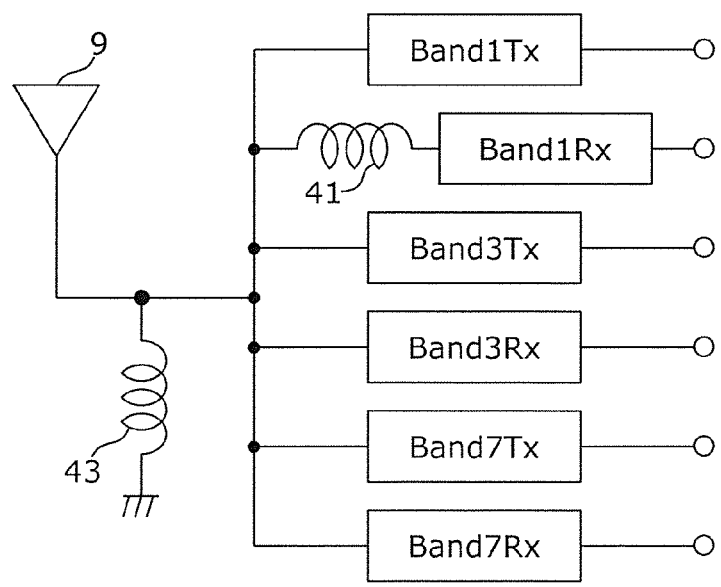

MULTIPLEXER, TRANSMISSION DEVICE, AND RECEPTION DEVICE

CROSS REFERENCE TO RELATED APPLICATIONS

This application claims the benefit of priority to Japanese Patent Application No. 2017-122822 filed on Jun. 23, 2017. The entire contents of this application are hereby incorporated herein by reference.

BACKGROUND OF THE INVENTION

1. Field of the Invention

The present invention relates to multiplexers provided with elastic wave filters, transmission devices, and reception devices.

2. Description of the Related Art

In recent years, cellular phones have been required to support a plurality of frequency bands and a plurality of radio systems, in other words, required to be capable of supporting multiband communication and multimode communication by a single terminal. To meet the above requirement, a multiplexer configured to demultiplex a high frequency signal containing a plurality of radio carrier frequencies is disposed immediately next to a single antenna. As a plurality of band pass filters defining the multiplexer, elastic wave filters exhibiting low loss within the pass band and steepness of the bandpass characteristics in the peripheries of the pass band are used.

International Publication No. 2016/208670 discloses a multiplexer in which a plurality of surface acoustic wave filters are provided and terminals of the filters on an antenna side are connected in common.

In the multiplexer of International Publication No. 2016/208670, an antenna end of one filter among the plurality of filters is connected to a common connection point with a first inductance element interposed therebetween, and an antenna end of each of the other filters is directly connected to the common connection point.

An impedance of the one filter seen through the first inductance element and a combined impedance of the other filters are designed so as to approach a complex conjugate. With this, impedances of all of the filters seen from the common connection point are adjusted to substantially the same complex impedance.

Further, in the multiplexer, the common connection point and an antenna terminal for connecting an antenna element are connected with a second inductance element interposed therebetween. The second inductance element corrects a shift of the adjusted complex impedance from the characteristic impedance of the antenna element.

As described above, in the multiplexer, the impedance of each of the plurality of filters is adjusted using the first inductance element, and the adjusted impedance is corrected to the characteristic impedance of the antenna element using the second inductance element. Because of this structure, according to the multiplexer of International Publication No. 2016/208670, impedance matching is able to be obtained with high precision using a small number of inductance elements.

The multiplexer of International Publication No. 2016/208670 may be provided using, for example, a mounting substrate in which an inductance element is incorporated. However, in this case, there arises a problem that the precision of impedance matching is affected by the arrangement of the inductance element inside the mounting substrate.

SUMMARY OF THE INVENTION

Preferred embodiments of the present invention provide multiplexers that each include a mounting substrate including an inductance element therein and that is capable of obtaining excellent impedance matching at an antenna terminal.

A multiplexer according to a preferred embodiment of the present invention includes a mounting substrate, one first elastic wave filter and one or more second elastic wave filters that are provided on one principal surface of the mounting substrate and have different pass bands from each other; and a first inductance element which is included in the mounting substrate, and one end of which is connected to one end of the first elastic wave filter. The other end of the first inductance element and one end of each of the one or more second elastic wave filters are connected to each other. The first elastic wave filter includes one or more first resonators defining a signal path connecting the one end and the other end of the first elastic wave filter, and one or more second resonators connected between the signal path and a reference terminal. At least one of the second resonators is connected between the one end of the first elastic wave filter and the first resonator closest to the one end of the first elastic wave filter in the signal path. Each of the one or more second elastic wave filters includes one or more third resonators defining a signal path connecting the one end and the other end of the second elastic wave filter, and one or more fourth resonators connected between the signal path and a reference terminal. The mounting substrate is a multilayer substrate in which wiring conductors are disposed in or on a plurality of wiring layers that are positioned at the one principal surface, at the other principal surface, and in an inner layer of the mounting substrate. The first inductance element includes a first wiring conductor disposed in or on at least one wiring layer of the plurality of wiring layers. The plurality of wiring layers include a wiring layer which is adjacent to the wiring layer at which the first wiring conductor is disposed, and in which a ground pattern is not provided in a portion overlapping with a formation region of the first inductance element in a plan view.

In this configuration, the impedance of the first elastic wave filter seen through the first inductance element and the combined impedance of all of the second elastic wave filters approach a complex conjugate. As such, the impedances of all of the filters seen from a common connection point of the other end of the first inductance element and the one end of each of the one or more second elastic wave filters, are adjusted to the same or substantially the same complex impedance. At this time, if parasitic capacitance is generated on the first inductance element, the impedance of the first inductance element is decreased and the impedance matching is degraded, thus preventing accurate impedance adjustment.

As such, with the above-described configuration, in the wiring layer adjacent to the wiring layer in which the first inductance element is provided, the ground pattern is not provided in the portion overlapping with the formation region of the first inductance element in a plan view. This prevents an increase in parasitic capacitance generated when a ground pattern is disposed adjacent to the first inductance element, thus reducing or preventing the decrease in impedance of the first inductance element. As a result, the impedance is accurately adjusted at the first elastic wave filter and each of the one or more second elastic wave filters, thus making it possible to obtain a multiplexer with excellent impedance matching.

The plurality of wiring layers may include a wiring layer which is adjacent, on the one principal surface side of the mounting substrate, to the wiring layer at which the first wiring conductor is provided, and in which a ground pattern is not provided in a portion overlapping with the formation region of the first inductance element in a plan view.

With this configuration, the wiring layers in each of which no ground pattern is provided are provided on both sides of the first inductance element, which effectively prevents an increase in parasitic capacitance generated on the first inductance element and makes it possible to reduce or prevent the decrease in impedance of the first inductance element.

A multiplexer according to a preferred embodiment of the present invention further includes a common signal terminal provided in or on the mounting substrate, and a second inductance element included in the mounting substrate and connected between the above common signal terminal and the common connection point of the other end of the first inductance element and the one end of each of the one or more second elastic wave filters. The second inductance element includes a second wiring conductor disposed in or on at least one of the plurality of wiring layers, and at least one of the wiring layers in or on which the second wiring conductor is disposed is positioned closer to the other principal surface of the mounting substrate than any of the wiring layers in or on which the first wiring conductor is disposed.

With this configuration, the impedances adjusted at the first elastic wave filter and the one or more second elastic wave filters is able to be further corrected by the second inductance element collectively. In general, a multiplexer in which filters are disposed on one principal surface of the mounting substrate, is mounted on a mother board, such as a printed circuit board, with the other principal surface of the mounting substrate interposed therebetween. As such, in accordance with the above-described configuration, of the first inductance element and the second inductance element, the second inductance element is disposed closer to the other principal surface of the mounting substrate, while the first inductance element is disposed farther from the other principal surface of the mounting substrate.

With this configuration, even if a ground pattern is provided on the other principal surface of the mounting substrate, the mother board, or other suitable location, the parasitic capacitance between the first inductance element and the ground pattern is reduced and the decrease in impedance of the first inductance element is reduced or prevented, such that a multiplexer having excellent impedance matching is obtained.

Although, conversely, the parasitic capacitance between the second inductance element and the ground pattern becomes large, it does not matter whether the stated parasitic capacitance becomes large or not. This is because the parasitic capacitance generated on the second inductance element has less unfavorable influence on the impedance matching than the parasitic capacitance generated on the first inductance element. To the contrary, by the increase in parasitic capacitance of the second inductance element, a pole due to LC resonance is generated on a higher frequency side outside the pass band, such that improved attenuation outside the pass band is able to be obtained.

A multiplexer according to a preferred embodiment of the present invention further include a common signal terminal provided in or on the mounting substrate, and a second inductance element included in the mounting substrate and connected between a reference terminal and a signal path connecting the common signal terminal and the common connection point of the other end of the first inductance element and the one end of each of the one or more second elastic wave filters. The second inductance element includes a second wiring conductor disposed in or on at least one of the plurality of wiring layers, and at least one of the wiring layers in or on which the second wiring conductor is disposed is located closer to the other principal surface of the mounting substrate than any of the wiring layers in or on which the first wiring conductor is disposed.

With this configuration, the impedances adjusted at the first elastic wave filter and the one or more second elastic wave filters are able to be further corrected by the second inductance element collectively. In general, a multiplexer in which filters are disposed on one principal surface of the mounting substrate, is mounted on a mother board, such as a printed circuit board, with the other principal surface of the mounting substrate interposed therebetween. As such, in accordance with the above-described configuration, of the first inductance element and the second inductance element, the second inductance element is disposed closer to the other principal surface of the mounting substrate, while the first inductance element is disposed farther from the other principal surface of the mounting substrate.

With this configuration, even if a ground pattern is provided on the other principal surface of the mounting substrate, the mother board, or other location, the parasitic capacitance between the first inductance element and the ground pattern is reduced and the decrease in impedance of the first inductance element is reduced or prevented, such that a multiplexer having excellent impedance matching is obtained.

Although, conversely, the parasitic capacitance between the second inductance element and the ground pattern becomes large, it does not matter whether the parasitic capacitance becomes large or not. This is because the parasitic capacitance generated on the second inductance element has less unfavorable influence on the impedance matching than the parasitic capacitance generated on the first inductance element. To the contrary, due to the increase in parasitic capacitance of the second inductance element, an L-value necessary to obtain the impedance matching becomes small, thus reducing the area. Because of this, unnecessary coupling with another inductor is reduced or prevented, so that improved attenuation inside the pass band is obtained.

A multiplexer according to a preferred embodiment of the present invention further includes a ground pattern provided on the other principal surface of the mounting substrate.

With this configuration, the parasitic capacitance between the second inductance element and the ground pattern provided on the other principal surface of the mounting substrate is increased, thus making it possible to improve attenuation outside or inside the pass band.

A transmission device according to a preferred embodiment of the present invention includes a multiplexer according to a preferred embodiment of the present invention, and at least one transmission circuit that is connected to the multiplexer and generate a plurality of transmission signals of mutually different frequency bands, wherein the multiplexer acquires the plurality of transmission signals from the at least one transmission circuit and combines the acquired transmission signals into a single antenna signal.

A reception device according to a preferred embodiment of the present invention includes a multiplexer according to a preferred embodiment of the present invention, and at least one reception circuit that is connected to the multiplexer and processes a plurality of reception signals of mutually different frequency bands, wherein the multiplexer isolates the plurality of reception signals from a single antenna signal containing the plurality of reception signals and supplies the isolated reception signals to the reception circuit.

As described above, based on the features of preferred embodiments of the multiplexers, transmission devices and reception devices excellent in impedance matching at the antenna terminal are obtained.

With multiplexers, transmission devices, and reception devices according to preferred embodiments of the present invention, excellent impedance matching is able to be obtained at the antenna terminal with a configuration including a mounting substrate in which an inductance element is provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 2B is a circuit diagram illustrating an example of a configuration of a reception-side filter of Band 25 according to the first preferred embodiment of the present invention.

FIG. 2C is a circuit diagram illustrating an example of a configuration of a transmission-side filter of Band 66 according to the first preferred embodiment of the present invention.

FIG. 2D is a circuit diagram illustrating an example of a configuration of a reception-side filter of Band 66 according to the first preferred embodiment of the present invention.

FIG. 18B is also a block diagram illustrating an example of a functional configuration of a multiplexer according to a variation on the second preferred embodiment of the present invention.

DETAILED DESCRIPTION OF THE PREFERRED EMBODIMENTS

Figure 1:
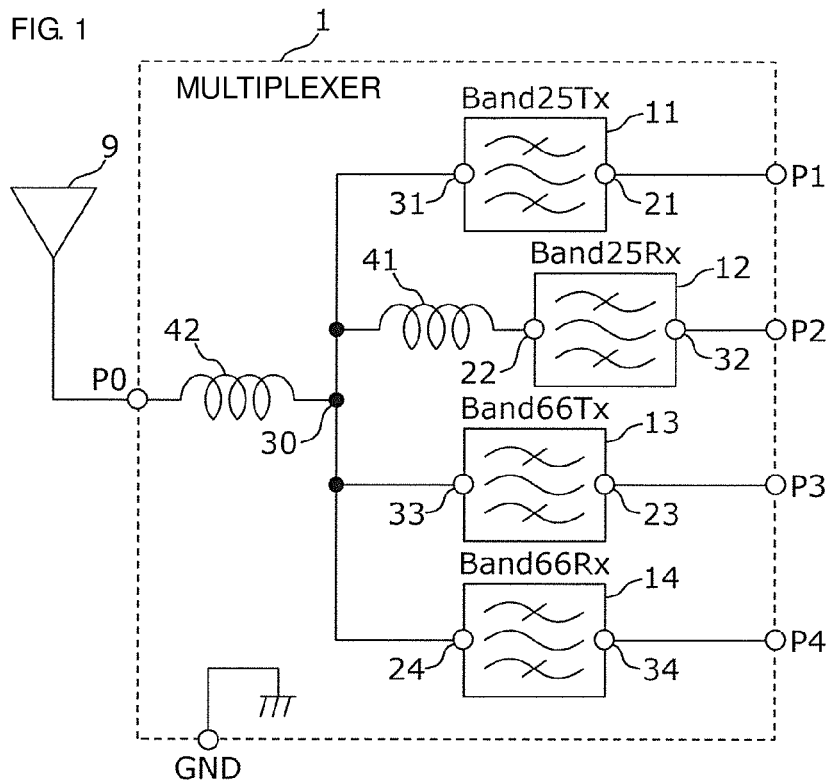
FIG. 1 is a block diagram illustrating an example of a functional configuration of a multiplexer according to a first preferred embodiment of the present invention.

Hereinafter, preferred embodiments of the present invention will be described in detail using working examples and with reference to the drawings. It is to be noted that all of the preferred embodiments described below represent generic or specific examples. Numerical values, shapes, materials, elements, arrangements of the elements, connection modes, and other features indicated in the following preferred embodiments are merely examples, and are not intended to limit the scope of the present invention. Of the elements included in the following preferred embodiments, those not recited in the independent claims of the present invention are described as arbitrary elements. In addition, sizes of the elements illustrated in the drawings or ratios of the sizes thereof are not necessarily accurate.

First Preferred Embodiment

In a first preferred embodiment of the present invention, a quadplexer is described that is applied to Band 25 (transmission frequency band: about 1850 MHz to about 1915 MHz, reception frequency band: about 1930 MHz to about 1995 MHz) and Band 66 (transmission frequency band: about 1710 MHz to about 1780 MHz, reception frequency band: about 2010 MHz to about 2200 MHz) of the LTE (Long Term Evolution) standard, for example. In the quadplexer, an antenna end of an unbalanced duplexer for Band 25 and an antenna end of a non-equilibrium duplexer for Band 66 connected in common.

FIG. 1 is a block diagram illustrating an example of a functional configuration of a multiplexer according to the first preferred embodiment. As illustrated in FIG. 1, a multiplexer 1 includes filters 11 to 14, inductance elements 41 and 42, a common signal terminal P0, selection signal terminals P1 to P4, and a ground terminal GND.

The filters 11 and 12 are preferably a transmission-side filter for Band 25 and a reception-side filter for Band 25, respectively, for example. The filters 13 and 14 are preferably a transmission-side filter for Band 66 and a reception-side filter for Band 66, respectively, for example. An input end 21 of the filter 11, an output end 32 of the filter 12, an input end 23 of the filter 13, and an output end 34 of the filter 14 are connected to the selection signal terminals P1 to P4, respectively. Output ends 31 and 33 of the filters 11 and 13, and an input end 24 of the filter 14 are connected to a common connection point 30. An input end 22 of the filter 12 is connected to the common connection point 30 with the inductance element 41 interposed therebetween. The common connection point 30 is connected to the common signal terminal P0 with the inductance element 42 interposed therebetween. The common signal terminal P0 is connected to an antenna element 9.

The inductance element 41 is an example of a first inductance element, and the inductance element 42 is an example of a second inductance element. The common signal terminal P0 is an example of an antenna terminal.

A transmission signal of Band 25 is supplied to the selection signal terminal P1 from a transmission circuit (not illustrated). The filter 11 acquires the transmission signal at the input end 21, performs filtering in a transmission pass band of Band 25 (about 1850 MHz to about 1915 MHz), and outputs the filtered signal from the output end 31. The transmission signal of Band 25 after the filtering is supplied to the antenna element 9 from the common signal terminal P0, through the common connection point 30 and the inductance element 42.

An antenna signal including a reception signal of Band 25 is supplied to the common signal terminal P0 from the antenna element 9. The filter 12 acquires the antenna signal, through the inductance element 42, the common connection point 30, and the inductance element 41, at the input end 22, performs filtering in a reception pass band of Band 25 (about 1930 MHz to about 1995 MHz), and outputs the filtered signal from the output end 32. The antenna signal after the filtering is supplied as a reception signal of Band 25 to a reception circuit (not illustrated) from the selection signal terminal P2.

A transmission signal of Band 66 is supplied to the selection signal terminal P3 from a transmission circuit (not illustrated). The filter 13 acquires the transmission signal at the input end 23, performs filtering in a transmission pass band of Band 66 (about 1710 MHz to about 1780 MHz), and outputs the filtered signal from the output end 33. The transmission signal of Band 66 after the filtering is supplied to the antenna element 9 from the common signal terminal P0, through the common connection point 30 and the inductance element 42.

An antenna signal including a reception signal of Band 66 is supplied to the common signal terminal P0 from the antenna element 9. The filter 14 acquires the antenna signal, through the inductance element 42 and the common connection point 30, at the input end 24, performs filtering in a reception pass band of Band 66 (about 2010 MHz to about 2200 MHz), and outputs the filtered signal from the output end 34. The antenna signal after the filtering is supplied as a reception signal of Band 66 to a reception circuit (not illustrated) from the selection signal terminal P4.

Configurations of the filters 11 to 14 will be described below. The configurations described below are merely examples, and are not intended to limit the specific configurations of the filters 11 to 14. That is, in accordance with the characteristics required for the filters 11 to 14, a different number of resonators, a different type of filter, e.g., a ladder or longitudinal coupling filter, or other suitable types of filters from that in the following description may be used.

Figure 2A:
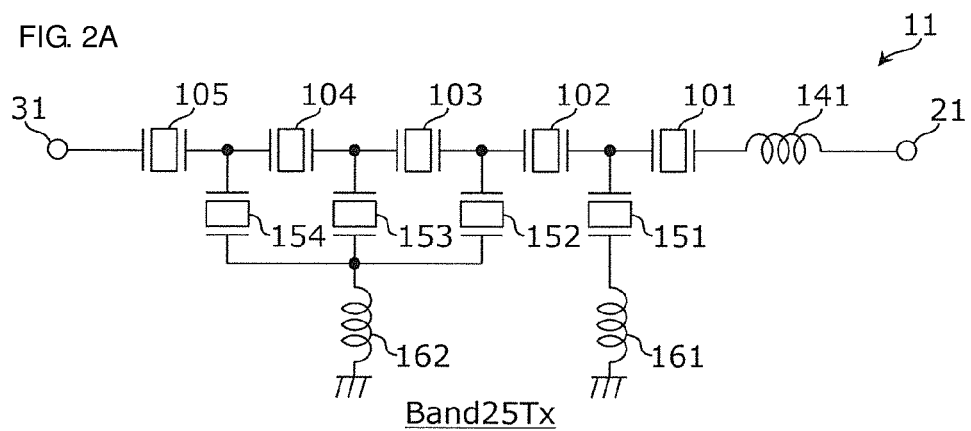
FIG. 2A is a circuit diagram illustrating an example of a configuration of a transmission-side filter of Band 25 according to the first preferred embodiment of the present invention.

FIG. 2A is a circuit diagram illustrating an example of a configuration of the filter 11. As illustrated in FIG. 2A, the filter 11 is preferably a ladder filter, for example, including a total of nine serial resonators 101 to 105 and parallel resonators 151 to 154. The filter 11 includes matching inductance elements 141, 161, and 162.

The filter 11 is an example of a second elastic wave filter. The serial resonators 101 to 105 are each an example of a first resonator defining a signal path connecting the output end 31 as one end of the filter 11 and the input end 21 as the other end thereof. The parallel resonators 151 to 154 are each an example of a second resonator connected between the above signal path and the ground terminal GND as a reference terminal.

FIG. 2B is a circuit diagram illustrating an example of a configuration of the filter 12. As illustrated in FIG. 2B, the filter 12 preferably includes a ladder filter including three parallel resonators 251 and 252 and a serial resonator 201, for example. In a subsequent stage of the ladder filter, longitudinal coupling filters 202 and 203 each including five resonators are connected in parallel, and a parallel resonator 253 is also connected.

The filter 12 is an example of a first elastic wave filter. The serial resonator 201 and the resonators of the longitudinal coupling filters 202 and 203 are each an example of a resonator defining a signal path connecting the input end 22 as one end of the filter 12 and the output end 32 as the other end thereof. Further, the parallel resonators 251 to 253 are each an example of a resonator connected between the signal path and the ground terminal GND as a reference terminal. In the filter 12, the parallel resonator 251 is connected between the input end 22 and the serial resonator 201 closest to the input end 22 in the signal path.

FIG. 2C is a circuit diagram illustrating an example of a configuration of the filter 13. As illustrated in FIG. 2C, the filter 13 is preferably a ladder filter, for example, a total of eight serial resonators 301 to 304 and parallel resonators 351 to 354. The filter 13 includes matching inductance elements 341, 361, and 362.

The filter 13 is an example of a second elastic wave filter. The serial resonators 301 to 304 are each an example of a resonator defining a signal path connecting the output end 33 as one end of the filter 13 and the input end 23 as the other end thereof. The parallel resonators 351 to 354 are each an example of a resonator connected between the signal path and the ground terminal GND as a reference terminal.

FIG. 2D is a circuit diagram illustrating an example of a configuration of the filter 14. As illustrated in FIG. 2D, the filter 14 is preferably a ladder filter, for example, including a total of nine serial resonators 401 to 405 and parallel resonators 451 to 454. The filter 14 includes a matching inductance element 461.

The filter 14 is an example of a second elastic wave filter. The serial resonators 401 to 405 are each an example of a resonator defining a signal path connecting the input end 24 as one end of the filter 14 and the output end 34 as the other end thereof. The parallel resonators 451 to 454 are each an example of a resonator connected between the signal path and the ground terminal GND as a reference terminal.

With the above-described configuration, the following impedance matching is obtained in the multiplexer 1.

A complex impedance of the filters 11, 13, and 14 being combined is capacitive when seen from the common connection point 30. On the other hand, a complex impedance of the filter 12 seen from the common connection point 30 is shifted towards being inductive by the inductance element 41. By synthesizing these complex impedances, the complex impedances of the filters 11 to 14 seen from the common connection point 30 are adjusted to the same or substantially the same complex impedance remaining slightly capacitive, for example.

The adjusted complex impedance is collectively shifted towards being inductive by the inductance element 42. As a result, the complex impedances of the filters 11 to 14 seen from the antenna element 9 become equivalent or substantially equivalent to the characteristic impedance of the antenna element 9, thus obtaining accurate impedance matching.

A structure of a resonator of the filters 11 to 14 will be described. Although a structure of a surface acoustic wave (SAW) resonator is described below, the structure is merely an example and is not intended to limit a specific structure of the resonator of the filters 11 to 14. That is, in accordance with the characteristics required for the filters 11 to 14, a different piezoelectric substrate structure from that in the following description, e.g., a FBAR (Film Bulk Acoustic Resonator) structure using bulk elastic waves, or other suitable resonators may be used.

Figure 3:
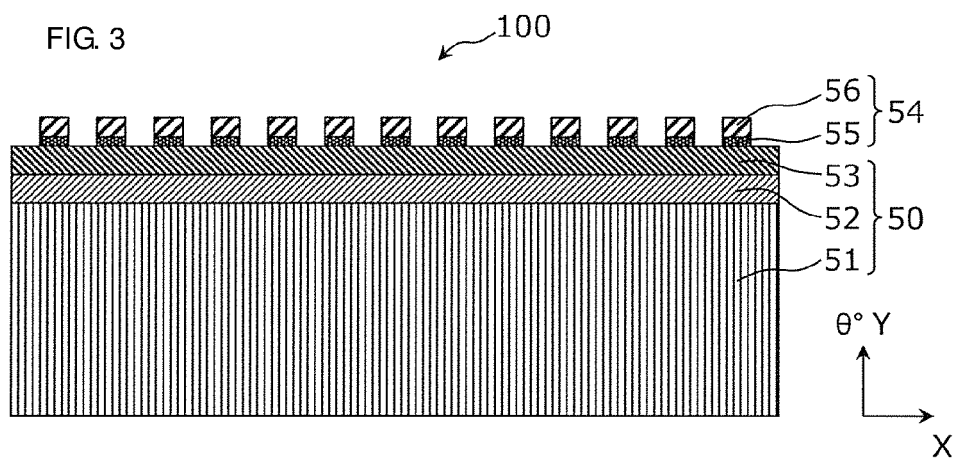
FIG. 3 is a cross-sectional view illustrating an example of a structure of a resonator according to the first preferred embodiment of the present invention.

FIG. 3 is a cross-sectional view illustrating an example of the structure of a resonator defining the filters 11 to 14. The structure illustrated in FIG. 3 is applied to the serial resonators and the parallel resonators of the filters 11 to 14, and is also applied to the resonators of the longitudinal coupling filters.

As illustrated in FIG. 3, a resonator 100 includes a substrate 50 and an interdigital transducer (IDT) electrode 54 disposed on the substrate 50.

The substrate 50 is preferably a multilayer body including a high acoustic velocity film 51, a low acoustic velocity film 52, and a piezoelectric film 53, for example.

The high acoustic velocity film 51 is a film in which an acoustic velocity of a bulk wave propagating therein is larger than those of a surface acoustic wave and a boundary wave propagating in the piezoelectric film 53. A silicon substrate is an example of the high acoustic velocity film 51 and a thickness thereof is preferably about 200 μm, for example. In FIG. 3, the high acoustic velocity film 51 also defines and functions as a support substrate to support the low acoustic velocity film 52, the piezoelectric film 53, and the IDT electrode 54. However, not being limited thereto, a support substrate may be provided, other than the high acoustic velocity film 51, below the high acoustic velocity film 51.

The low acoustic velocity film 52 is provided on the high acoustic velocity film 51, and an acoustic velocity of a bulk wave propagating therein is smaller than those of the surface acoustic wave and the boundary wave propagating in the piezoelectric film 53. A film including silicon dioxide as a main ingredient is an example of the low acoustic wave film 52, and a thickness thereof is preferably about 670 nm, for example.

The piezoelectric film 53 is provided on the low acoustic velocity film 52, the surface acoustic wave propagates therein. Lithium tantalate single crystal of θ-rotated Y-cut X-propagation or ceramic material may preferably be used for the piezoelectric film 53, and a thickness thereof is preferably about 600 nm, for example. Here, "lithium tantalate single crystal of θ-rotated Y-cut X-propagation or ceramic material" refers to lithium tantalate single crystal that is cut along a surface taking, as a normal line, an axis rotated around an X-axis by an angle of θ from a Y-axis where a propagation direction of the surface acoustic wave is the X-axis direction, or a ceramic material. The value of θ is preferably, for example, about 50 degrees.

The IDT electrode 54 includes a pair of comb-shaped electrodes provided on the piezoelectric film 53, and excites the piezoelectric film 53 in response to an applied electric signal. The IDT electrode 54 is preferably, for example, a multilayer film including a main electrode layer 56 made of aluminum including about 1% of copper and having a thickness of about 162 nm that is provided on a close contact layer 55 with a thickness of about 12 nm including a main ingredient of titanium. On the main electrode layer 56, a protection layer with a thickness of about 25 nm whose main ingredient is silicon dioxide may further be provided (not illustrated).

According to the above-described structure, by providing the low acoustic velocity film 52, energy of the elastic wave is effectively confined inside the piezoelectric film 53 and the low acoustic velocity film 52 based on elastic wave properties that concentrate the energy thereof in a medium of a small acoustic velocity. In addition, the high acoustic velocity film 51 reduces or prevents leakage of the elastic wave from the high acoustic velocity film 51 towards a structure on a lower side (not illustrated). As a result, the resonator 100 with small loss and a high Q-value is obtained.

In a filter provided with matching elements, such as an inductance element and a capacitance element, it is difficult to prevent an increase in loss and a decrease in a Q-value due to the matching elements. However, the resonator 100 compensates, with small loss and a high Q-value of the resonator 100, for the increase in loss and the decrease in the Q-value due to the matching elements, thus making it possible to obtain a filter having excellent characteristics.

The IDT electrodes 54 defining a plurality of resonators 100 may be provided on the substrate 50. Further, by providing, on the substrate 50, wiring conductors (not illustrated) connected with the IDT electrodes 54, the resonators 100 may be wired to each other. For example, the filters 11 to 14 may be defined as chip components by providing the plurality of resonators included in the filters 11 to 14 and the substrate 50 in which the resonators are wired to each other. The matching inductance elements, e.g., the inductance element 141 of the filter 11 and the inductance element 341 of the filter 13, included in the filters 11 to 14 may not be incorporated in the chip components, but may be provided as external components.

A structure of the multiplexer 1 will be described below. In the following, as an example, a structure of a multiplexer as a module component in which filters as chip components are mounted on a mounting substrate or a portion of the module component is described and illustrated.

Figure 4:
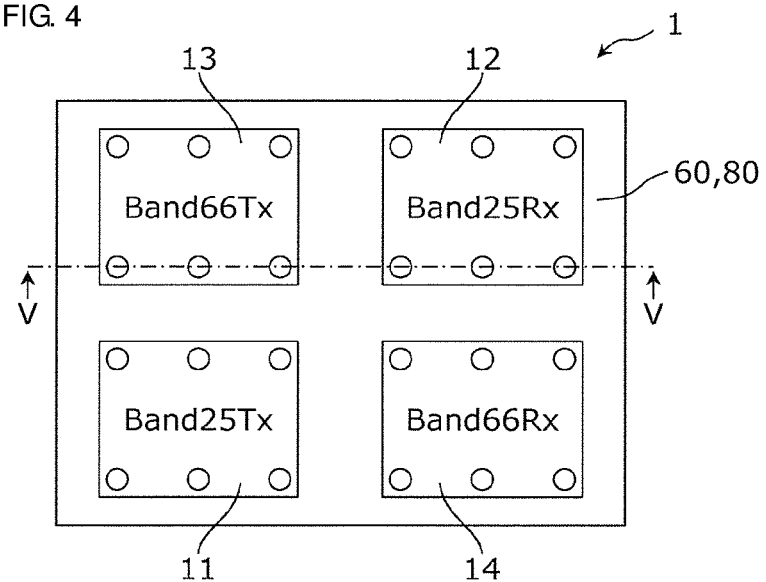
FIG. 4 is a plan view illustrating an example of the structure of a multiplexer according to the first preferred embodiment of the present invention.
Figure 5:
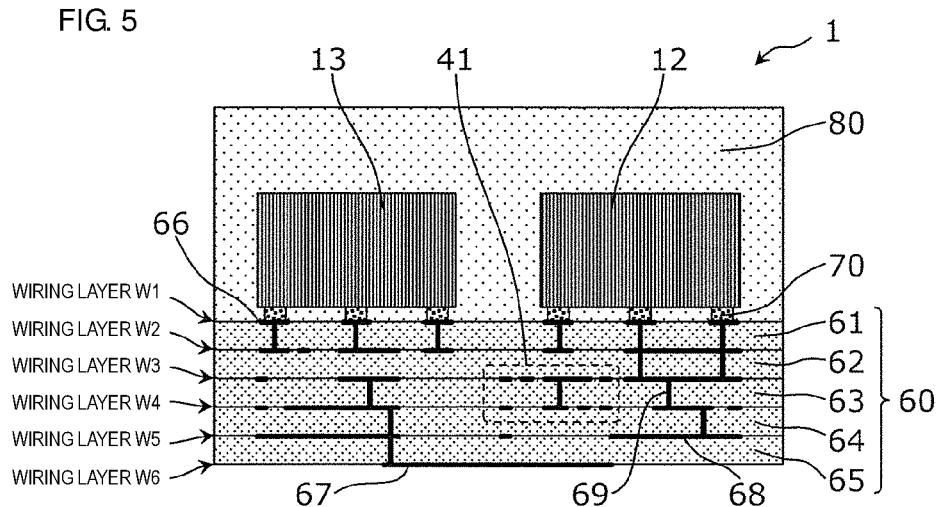
FIG. 5 is a cross-sectional view illustrating an example of the structure of the multiplexer according to the first preferred embodiment of the present invention.

FIGS. 4 and 5 are respectively a plan view and a cross-sectional view illustrating an example of the structure of the multiplexer 1. FIG. 5 corresponds to a cross section taken along a V-V cutting line and viewed in a direction of the arrows in FIG. 4.

As illustrated in FIGS. 4 and 5, the multiplexer 1 includes a mounting substrate 60, a conductive bonding material 70, the filters 11 to 14, and a sealing layer 80.

The mounting substrate 60 is preferably a multilayer substrate including base material layers 61 to 65 that are laminated, and the base material layers 61 to 65 are made of resin, such as phenol or epoxy, for example. Connection electrodes 66 and 67 are provided on one principal surface and the other principal surface of the mounting substrate 60 respectively, an in-plane conductor 68 (wiring pattern) is provided on an interface between the base material layers adjacent to each other, and an interlayer conductor 69 (via) is provided passing through the base material layer.

The connection electrode 66 connects the filters 11 to 14. The chip filters 11 to 14 are each attached to the connection electrode 66 using the conductive bonding material 70, such as solder, for example. The connection electrode 67 defines the common signal terminal P0, the selection signal terminals P1 to P4, and the ground terminal GND. The multiplexer 1 is mounted on a mother board, such as a printed circuit board (not illustrated), for example, via the connection electrode 67. The connection electrodes 66 and 67 are preferably made of a copper alloy foil, and metal plating, such as gold plating is performed thereupon, for example.

The in-plane conductor 68 and the interlayer conductor 69 define the circuit (including the inductance elements 41 and 42) of the multiplexer 1 as illustrated in FIG. 1. The in-plane conductor 68 is preferably made of, for example, a copper alloy foil disposed on surfaces of the base material layers 61 to 65. The interlayer conductor 69 is preferably made of, for example, copper alloy plated on an inner wall of a through-hole provided in each of the base material layers 61 to 65.

The sealing layer 80 seals an upper surface of the mounting substrate 60 and the filters 11 to 14. The sealing layer 80 is preferably made of, for example, thermosetting resin or ultraviolet curing resin.

The arrangement of the inductance elements 41 and 42 in the mounting substrate 60 will be described below. Note that the arrangement described below is merely an example, and is not intended to limit the specific arrangement of the inductance elements 41 and 42. That is, arrangements different from the arrangement described below may be used in accordance with a design for the arrangement of the inductance elements 41 and 42 to be explained later.

Hereinafter, for the sake of convenience in explanation, exposure surfaces and bonding surfaces of the base material layers 61 to 65 in the mounting substrate 60 are represented as wiring layers W1 to W6 respectively in the order of distance to the filters 11 to 14 from closest to farthest. The wiring layers W1 and W6 are provided on the one principal surface and the other principal surface of the mounting substrate 60 respectively, and the wiring layers W2 to W5 are provided in an inner layer of the mounting substrate 60. In the case in which relative positions of the wiring layers W1 to W6 are described using the terms "upper" and "lower", the wiring layer W1 is positioned on an upper side while the wiring layer W6 is positioned on a lower side.

Figure 6:
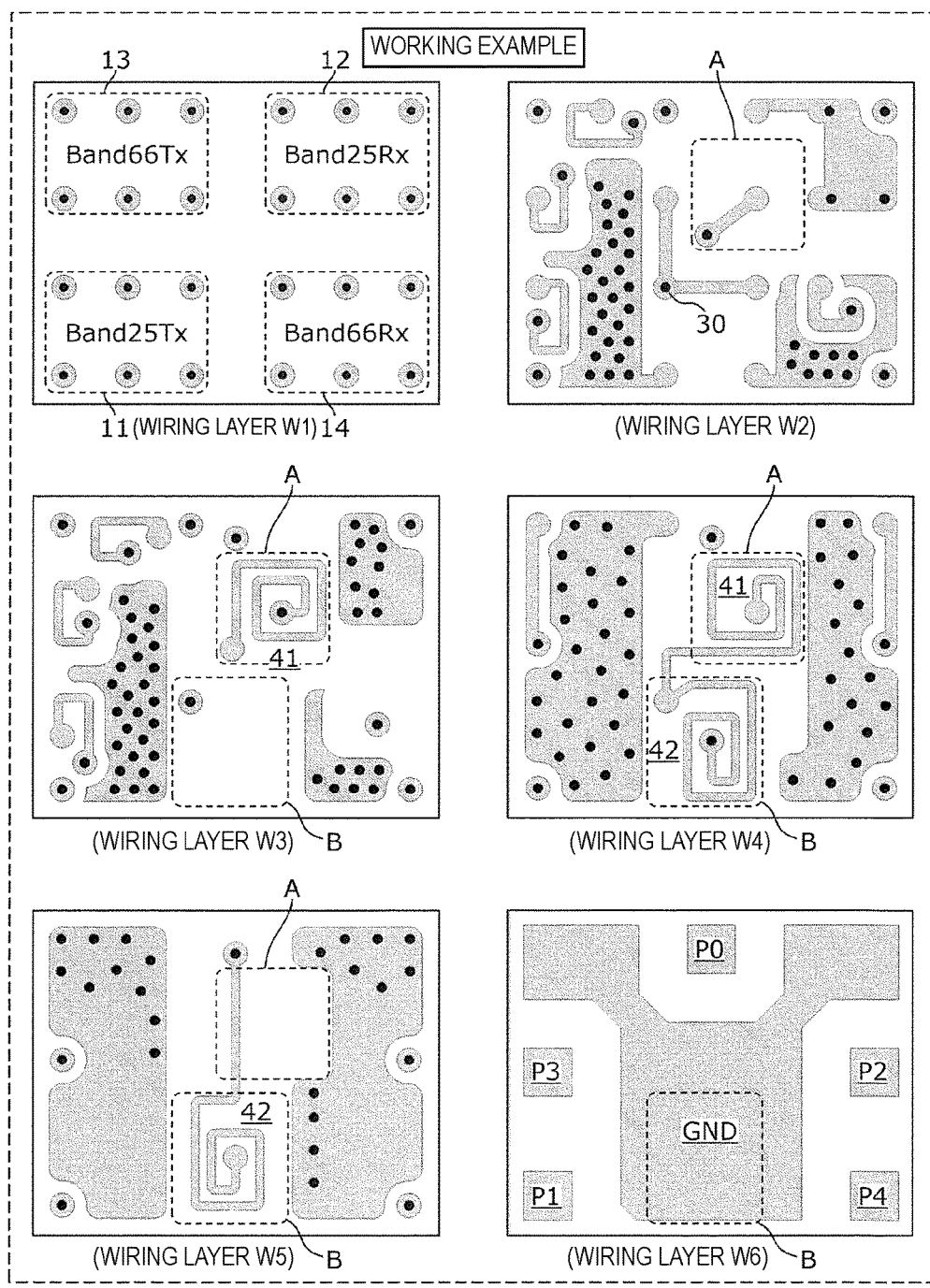
FIG. 6 is a plan view illustrating a working example of the layout in a mounting substrate according to the first preferred embodiment of the present invention.

FIG. 6 is a plan view illustrating an example of the layout in the mounting substrate 60. In the FIG. 6, an example of the layout of the connection electrodes 66 and 67, the in-plane conductor 68, and the interlayer conductor 69 that are arranged in the wiring layers W1 to W6 is illustrated.

In FIG. 6, gray regions indicate the connection electrodes 66 and 67 and the in-plane conductor 68, and a black circle indicates the interlayer conductor 69 provided between the wiring layer and the wiring layer positioned on a lower side by one layer. Broken-line frames indicate regions at which the filters 11 to 14 and the inductance elements 41 and 42 are provided.

Spiral in-plane conductors provided in a region A of the wiring layers W3 and W4 are connected with the interlayer conductor, thus defining the inductance element 41. The spiral in-plane conductors provided in the region A of the wiring layers W3 and W4 and the interlayer conductor connecting the stated in-plane conductors are an example of a first wiring conductor. No ground pattern is provided in a region A of the wiring layers W2 and W5.

The ground pattern refers to a sheet-shaped wiring conductor connected to the ground electrode as a reference terminal. The expression "no ground pattern is provided in a portion overlapping with the region A" means that a ground pattern having a substantial size is not present in the portion. For example, a ground pattern may be present with an area ratio of less than about 10% in the portion. With this, the following case is included in the case of no ground pattern being provided: a case in which linear ground wiring that connects two points enters the portion, the ground pattern enters the portion due to an alignment shift, or other deviations.

As described above, the mounting substrate 60 includes the wiring layer W5 in which no ground pattern is provided in a portion overlapping with the region A in which the inductance element 41 is provided in a plan view, adjacent to the wiring layer W4, in which the first wiring conductor is disposed, on the other principal surface side of the mounting substrate 60.

Further, the mounting substrate 60 includes the wiring layer W2 in which no ground pattern is provided in a portion overlapping with the region A in which the inductance element 41 is provided in a plan view, adjacent to the wiring layer W3, in which the first wiring conductor is disposed, on the one principal surface side of the mounting substrate 60.

Spiral in-plane conductors provided in a region B of the wiring layers W4 and W5 are connected with the interlayer conductor, thus defining the inductance element 42. The spiral in-plane conductors provided in the region B of the wiring layers W4 and W5 and the interlayer conductor connecting the in-plane conductors are an example of a second wiring conductor.

As described above, of the wiring layers in which the second wiring conductor is disposed, at least the wiring layer W5 is positioned closer to the other principal surface of the mounting substrate 60 than any of the wiring layers W3 and W4, in which the first wiring conductor is disposed.

In a case in which parasitic capacitance is generated on the inductance element 41, the impedance of the inductance element 41 decreases, so that impedance matching at the common signal terminal P0 is degraded. As such, in accordance with the layout illustrated in FIG. 6, a ground pattern is not provided in the portion overlapping with the region A in which the inductance element 41 is provided, in the wiring layers W2 and W5 respectively adjacent to the wiring layers W3 and W4, in which the inductance element 41 is provided.

This prevents an increase in parasitic capacitance generated when a ground pattern is disposed adjacent to the inductance element 41 and reduces or prevents the decrease in impedance of the inductance element 41, thus obtaining a multiplexer having excellent impedance matching at the common signal terminal P0.

Further, according to the layout illustrated in FIG. 6, of the inductance elements 41 and 42, the inductance element 41 is disposed farther from the other principal surface of the mounting substrate, while the inductance element 42 is disposed closer to the other principal surface of the mounting substrate.

This reduces parasitic capacitance between the inductance element 41 and a ground pattern included in the mother board (not illustrated), and reduces or prevents the decrease in impedance of the inductance element 41, thus obtaining a multiplexer having excellent impedance matching at the common signal terminal P0 (antenna terminal).

In the layout illustrated in FIG. 6, although parasitic capacitance between the inductance element 42 and a ground pattern included in the mother board (not illustrated) is likely to increase, parasitic capacitance generated on the inductance element 42 imparts less unfavorable influence to the impedance matching than that generated on the inductance element 41. To the contrary, the increase in parasitic capacitance of the inductance element 42 causes a pole due to the LC resonance to be generated on a higher frequency side outside the pass band, thus effectively improving the attenuation outside the pass band.

A ground pattern is provided as the connection electrode 67 in the wiring layer W6 in the layout in FIG. 6. This increases the parasitic capacitance between the inductance element 42 and the ground pattern provided in the wiring layer W6, thus improving the attenuation outside the pass band with more certainty.

In order to confirm the above-described effects, a comparative example of the layout in the mounting substrate 60 was prepared, and simulation was performed based on the layouts of the working example and the comparative example to calculate signal propagation characteristics of the multiplexer.

Figure 7:
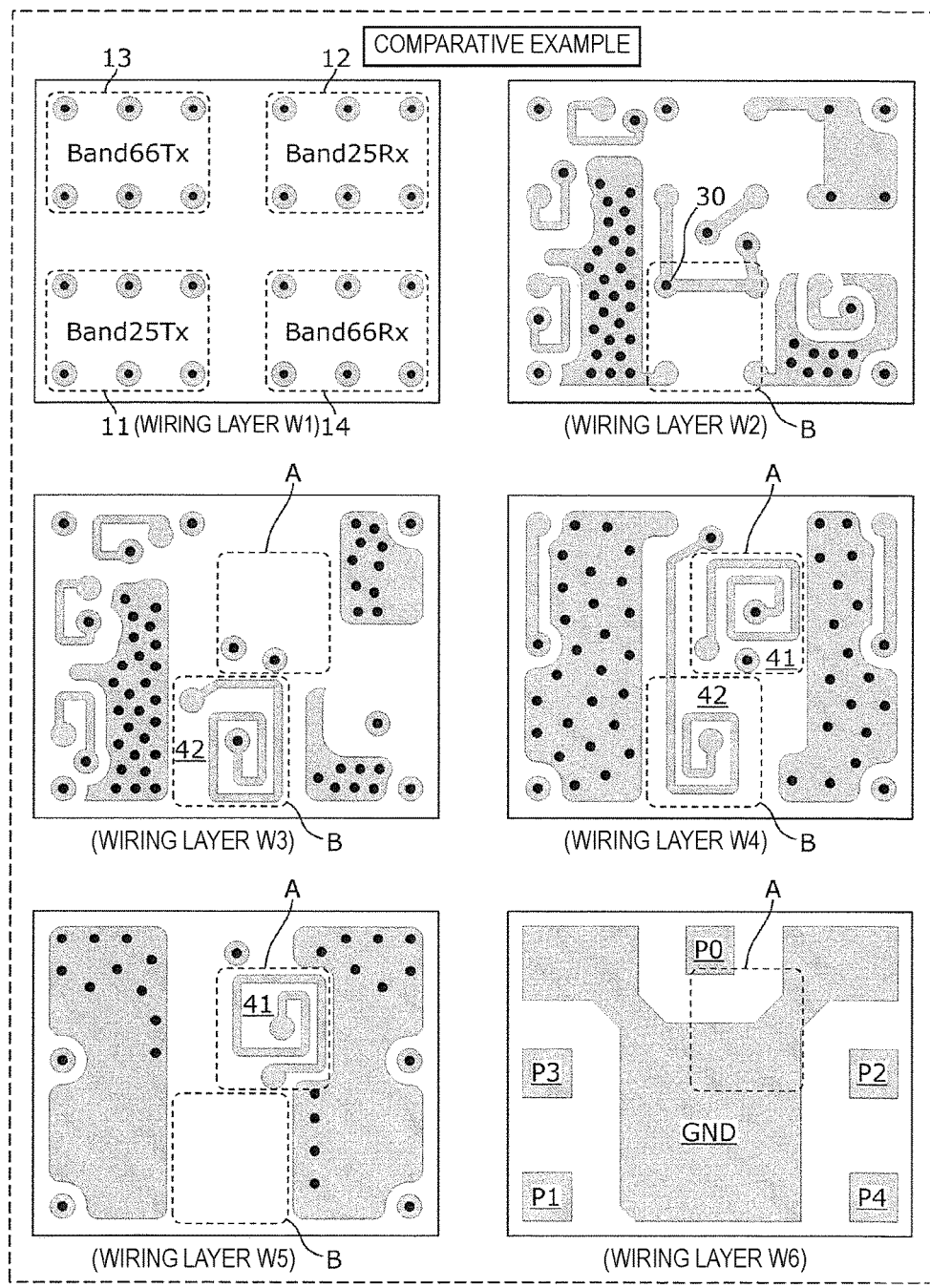
FIG. 7 is a plan view illustrating a comparative example of the layout in a mounting substrate according to the first preferred embodiment of the present invention.
Figure 8A:
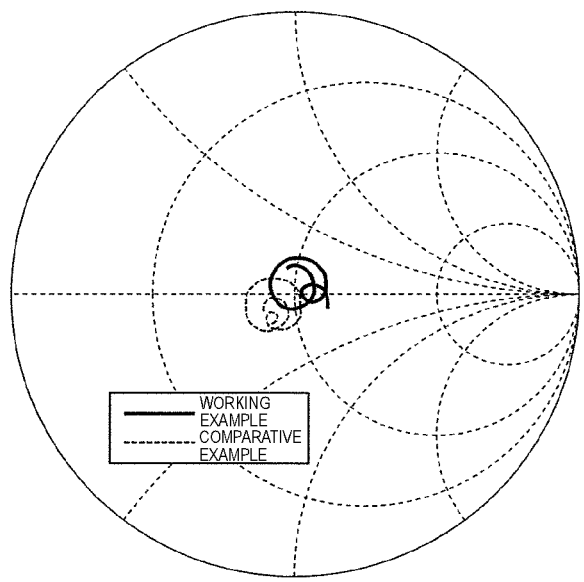
FIG. 8A is a Smith chart showing an example of a complex impedance seen from an antenna end of the transmission-side filter of Band 25 according to the first preferred embodiment of the present invention.
Figure 8B:
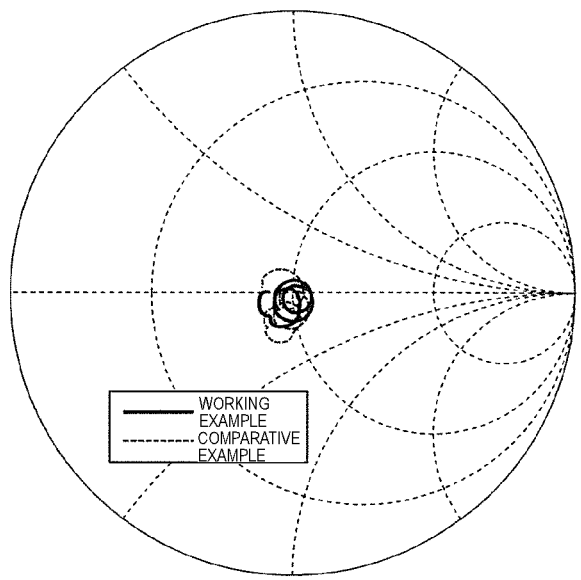
FIG. 8B is a Smith chart showing an example of a complex impedance seen from an antenna end of the reception-side filter of Band 25 according to the first preferred embodiment of the present invention.
Figure 8C:
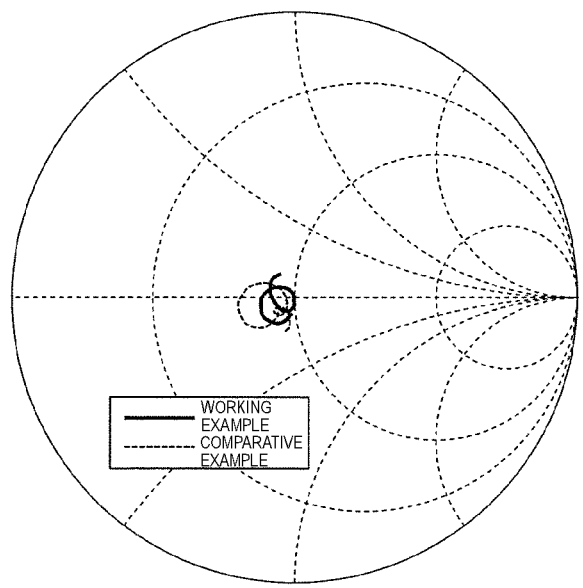
FIG. 8C is a Smith chart showing an example of a complex impedance seen from an antenna end of the transmission-side filter of Band 66 according to the first preferred embodiment of the present invention.
Figure 8D:
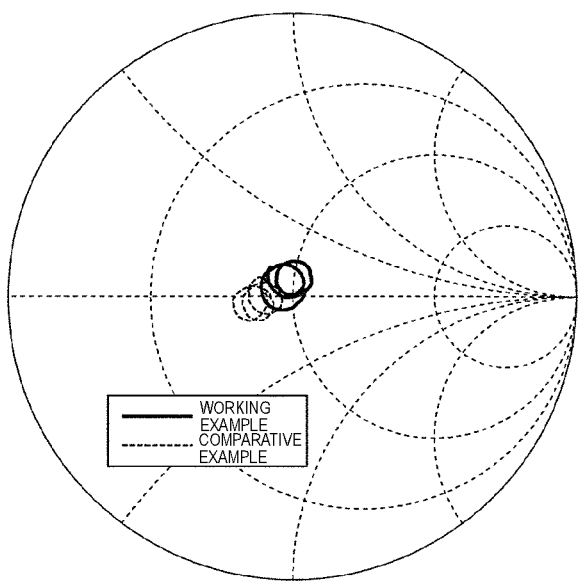
FIG. 8D is a Smith chart showing an example of a complex impedance seen from an antenna end of the reception-side filter of Band 66 according to the first preferred embodiment of the present invention.

FIG. 7 is a plan view illustrating the comparative example of the layout in the mounting substrate 60. In the FIG. 7, an example of the layout of the connection electrodes 66 and 67, the in-plane conductor 68, and the interlayer conductor 69 that are disposed in the wiring layers W1 to W6 is illustrated. Because the notations in FIG. 7 is the same as that in FIG. 6, description thereof is not repeated.

The layout of the comparative example in FIG. 7 is different from the layout of the working example in FIG. 6 in the following points. The inductance element 41 is provided in the wiring layers W4 and W5, and the inductance element 42 is provided in the wiring layers W3 and W4. Further, a ground pattern is provided in a portion of the wiring layer W6, which is adjacent to the wiring layer W5, overlapping with a region A in which the inductance element 41 is provided in a plan view. The multiplexer configured in accordance with the layout of the comparative example cannot sufficiently exhibit the above-described advantageous effects due to these differences.

FIGS. 8A to 8D are Smith charts showing complex impedances of the filters 11 to 14 seen from the common signal terminal P0, where a solid line represents the working example and a dotted line represents the comparative example. As shown in FIGS. 8A to 8D, of the complex impedances of the filters, the complex impedances in the working example preferably agree with the characteristic impedance. However, variations are seen in the comparative example.

Figure 9:
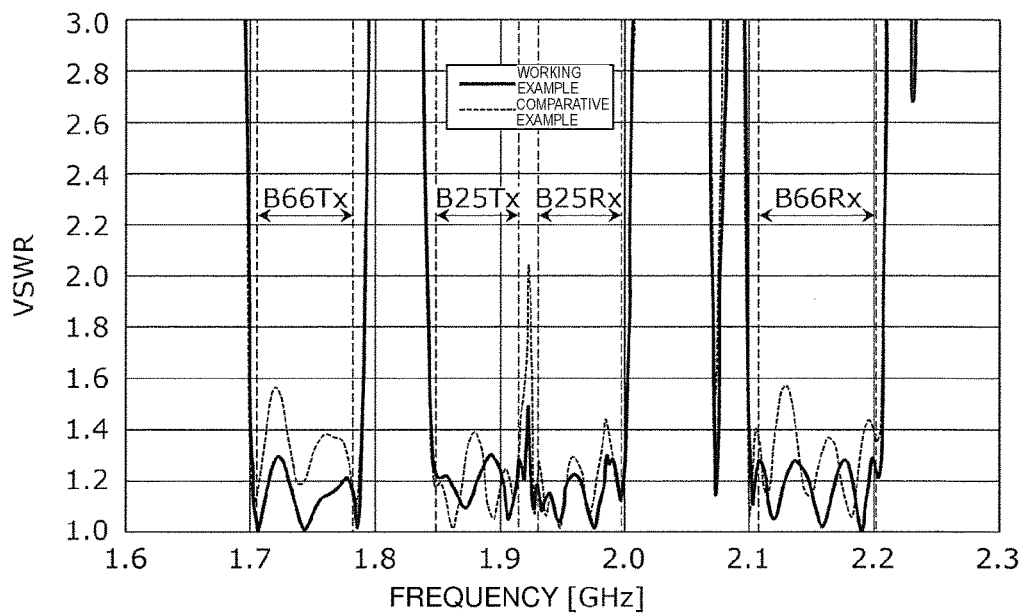
FIG. 9 is a graph showing an example of a VSWR (Voltage Standing Wave Ratio) of the multiplexer according to the first preferred embodiment of the present invention.

FIG. 9 is a graph showing VSWRs of the filters 11 to 14 seen from the common signal terminal P0, where a solid line represents the working example and a dotted line represents the comparative example. As shown in FIG. 9, the VSWRs of the filters 11 to 14 seen from the common signal terminal P0 are no more than about 1.30 in all of the frequency bands in the working example. However, a maximum value of about 1.40 to about 1.55 is observed in each frequency band in the comparative example.

Figure 10:
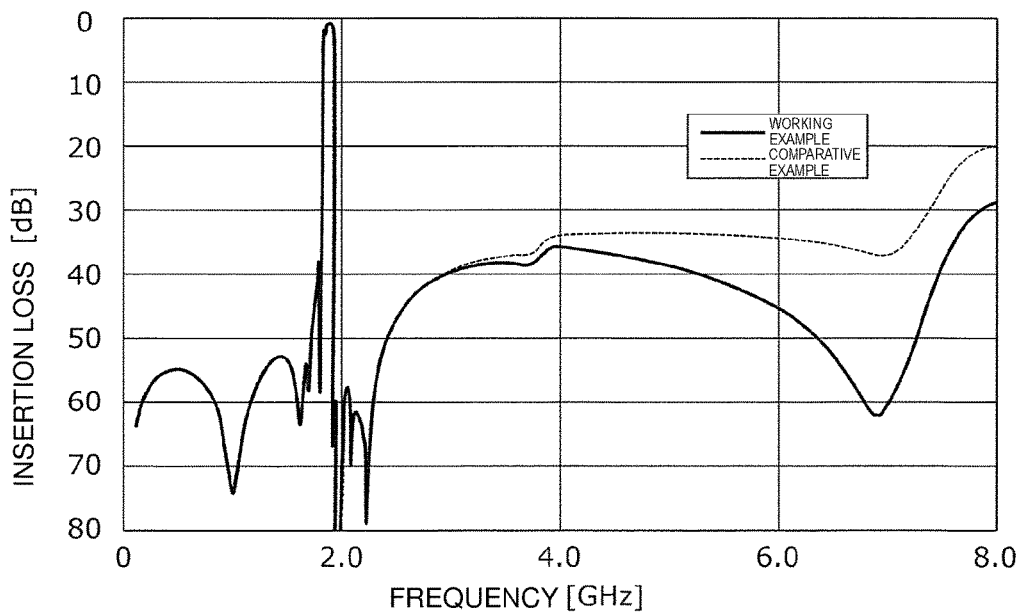
FIG. 10 is a graph showing an example of insertion loss of the multiplexer according to the first preferred embodiment of the present invention.

FIG. 10 is a graph showing insertion loss of the filter 11 seen from the common signal terminal P0, where a solid line represents the working example and a dotted line represents the comparative example. As shown in FIG. 10, a pole is generated near about 7 GHz in the working example, thus improving the attenuation on a high frequency side outside the pass band in comparison with the comparative example.

From the results of the simulation, it has been confirmed that the signal propagation characteristics are improved in the working example based on the impedance matching with high precision in comparison with the comparative example.

Figure 11A:
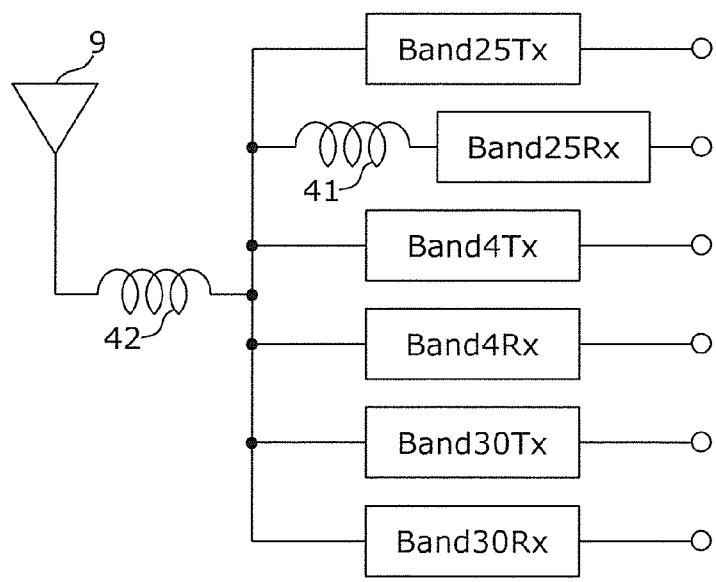
FIG. 11A is a block diagram illustrating an example of a functional configuration of a multiplexer according to a variation on the first preferred embodiment of the present invention.
Figure 11B:
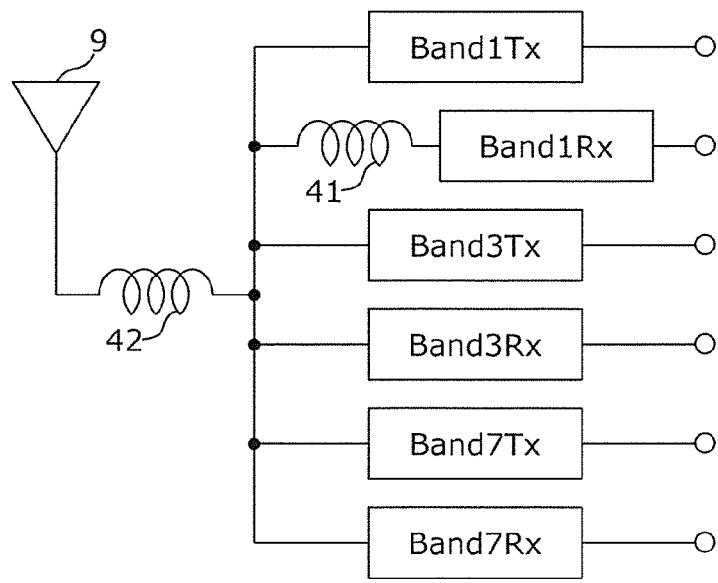
FIG. 11B is also a block diagram illustrating an example of a functional configuration of a multiplexer according to a variation on the first preferred embodiment of the present invention.

The structure and advantageous effects according to a preferred embodiment of the multiplexer have been described using an example of the quadplexer applied to Band 25 and Band 66. However, the same or substantially the same advantageous effects are also able to be obtained by a quadplexer of another combination, such as a combination of Bands 1 and 3 or a combination of Bands 3 and 7, for example. Moreover, not being limited to the quadplexer, a multiplexer that achieves more accurate impedance matching is able to be obtained as a hexaplexer combining three bands as illustrated in FIGS. 11A and 11B, or other suitable multiplexers.

Second Preferred Embodiment

Figure 12:
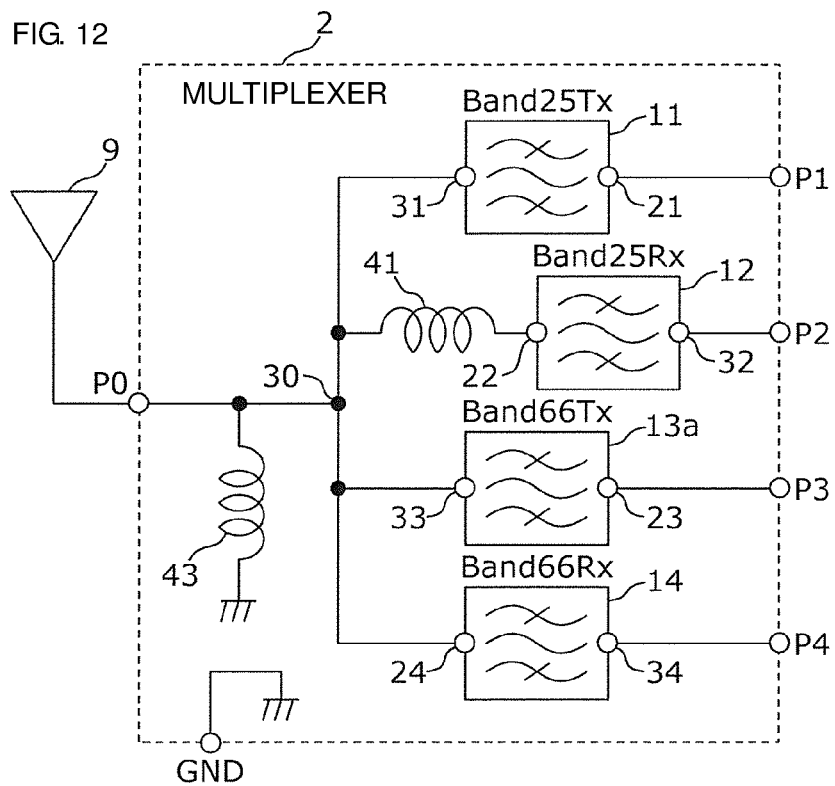
FIG. 12 is a block diagram illustrating an example of a functional configuration of a multiplexer according to a second preferred embodiment of the present invention.

FIG. 12 is a block diagram illustrating an example of a functional configuration of a multiplexer according to a second preferred embodiment of the present invention. As illustrated in FIG. 12, a multiplexer 2 includes filters 11 to 14, inductance elements 41 and 43, a common signal terminal P0, selection signal terminals P1 to P4, and a ground terminal GND.

In the multiplexer 2, compared to the multiplexer 1 in FIG. 1, a filter 13a as the transmission-side filter for Band 66 and the inductance element 43 are changed. The inductance element 43 is connected between a reference terminal and a signal path connecting a common connection point 30 and the common signal terminal P0.

Figure 13:
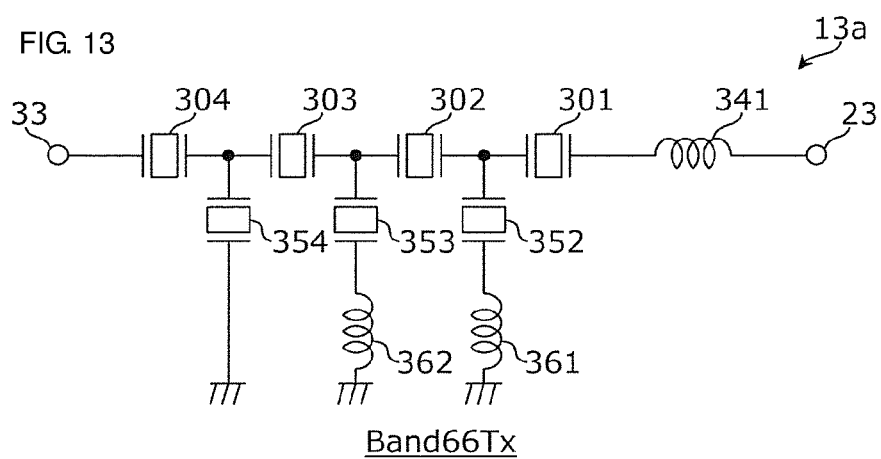
FIG. 13 is a circuit diagram illustrating an example of a circuit configuration of a transmission-side filter of Band 66 configuring the multiplexer according to the second preferred embodiment of the present invention.

FIG. 13 is a circuit diagram illustrating an example of a configuration of the filter 13a. As illustrated in FIG. 13, in the filter 13a, the parallel resonator 351 is removed from the filter 13 illustrated in FIG. 2C.

With the above-described configuration, impedance matching is obtained as described below in the multiplexer 2.

A complex impedance, seen from the common connection point 30, of the filters 11, 13a, and 14 being combined is capacitive. On the other hand, the complex impedance of the filter 12 seen from the common connection point 30 is shifted towards being inductive by the inductance element 41. By combining these complex impedances, complex impedances of the filters 11 to 14 seen from the common connection point 30 are adjusted to the same or substantially the same complex impedance remaining slightly capacitive, for example.

The adjusted complex impedance is further shifted towards being inductive by the inductance element 43. As a result, the complex impedances of the filters 11 to 14 seen from an antenna element 9 become equivalent or substantially equivalent to the characteristic impedance of the antenna element 9, thus obtaining accurate impedance matching.

Figure 14:
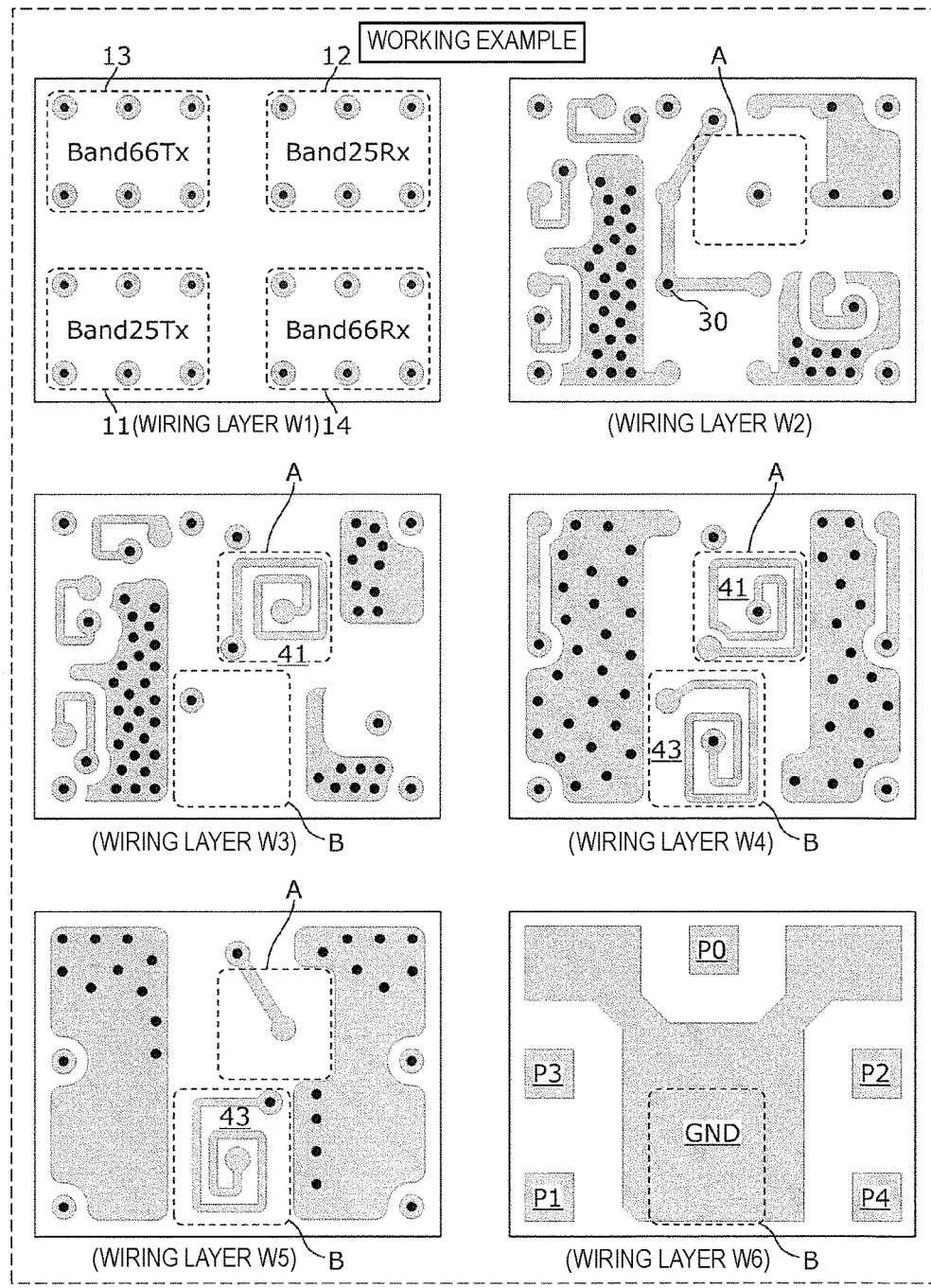
FIG. 14 is a plan view illustrating a working example of a wiring layout in a mounting substrate of the multiplexer according to the second preferred embodiment of the present invention.

FIG. 14 is a plan view illustrating a working example of a layout in the mounting substrate 60. In the FIG. 14, an example is illustrated of a layout of connection electrodes 66 and 67, an in-plane conductor 68, and an interlayer conductor 69 that are arranged in wiring layers W1 to W6.

In the layout in FIG. 14, similar to the layout in FIG. 6, the inductance element 41 is defined by connecting, with the interlayer conductor, spiral in-plane conductors provided in a region A of the wiring layers W3 and W4. The spiral in-plane conductors provided in the region A of the wiring layers W3 and W4 and the interlayer conductor connecting the in-plane conductors are an example of the first wiring conductor. No ground pattern is provided in a region A of the wiring layers W2 and W5.

As discussed above, the mounting substrate 60 includes the wiring layer W5 in which no ground pattern is provided in a portion overlapping with the region A in which the inductance element 41 is provided in a plan view, adjacent to the wiring layer W4, in which the first wiring conductor is disposed, on the other principal surface side of the mounting substrate 60.

Further, the mounting substrate 60 includes the wiring layer W2 in which no ground pattern is provided in a portion overlapping with the region A in which the inductance element 41 is provided in a plan view, adjacent to the wiring layer W3, in which the first wiring conductor is disposed, on the one principal surface side of the mounting substrate 60.

Spiral in-plane conductors provided in a region B of the wiring layers W4 and W5 are connected with the interlayer conductor, thus defining the inductance element 43. The spiral in-plane conductors provided in the region B of the wiring layers W4 and W5 and the interlayer conductor connecting the in-plane conductors are an example of the second wiring conductor.

As described above, of the wiring layers in which the second wiring conductor is disposed, at least the wiring layer W5 is positioned closer to the other principal surface of the mounting substrate 60 than any of the wiring layers W3 and W4, in which the first wiring conductor is disposed.

Further, of the inductance elements 41 and 43, the inductance element 41 is disposed farther from the other principal surface of the mounting substrate, while the inductance element 43 is disposed closer to the other principal surface of the mounting substrate.

With the layout in FIG. 14, because parasitic capacitance generated on the inductance element 41 is reduced or prevented due to the same or substantially the same structure as that of the layout in FIG. 6 and the decrease in impedance of the inductance element 41 is reduced or prevented, a multiplexer having excellent impedance matching at the common signal terminal P0 is obtained.

In the layout illustrated in FIG. 14, although parasitic capacitance between the inductance element 43 and a ground pattern included in the mother board (not illustrated) is likely to increase, parasitic capacitance generated on the inductance element 43 imparts less unfavorable influence to the impedance matching than that generated on the inductance element 41. Moreover, the increase in parasitic capacitance of the inductance element 43 allows an L-value necessary to obtain the impedance matching to be small, and consequently makes the area small. Because of this, unnecessary coupling with another inductor is reduced or prevented, thus effectively improving the attenuation inside the pass band.

A ground pattern is provided as the connection electrode 67 in the wiring layer W6 in the layout of FIG. 14. This increases the parasitic capacitance between the inductance element 43 and the ground pattern provided in the wiring layer W6, thus improving the attenuation inside the pass band with more certainty.

In order to confirm the above-described advantageous effects, a comparative example of the layout in the mounting substrate 60 was prepared, and simulation was performed based on the layouts of the working example and the comparative example to calculate signal propagation characteristics of the multiplexer.

Figure 15:
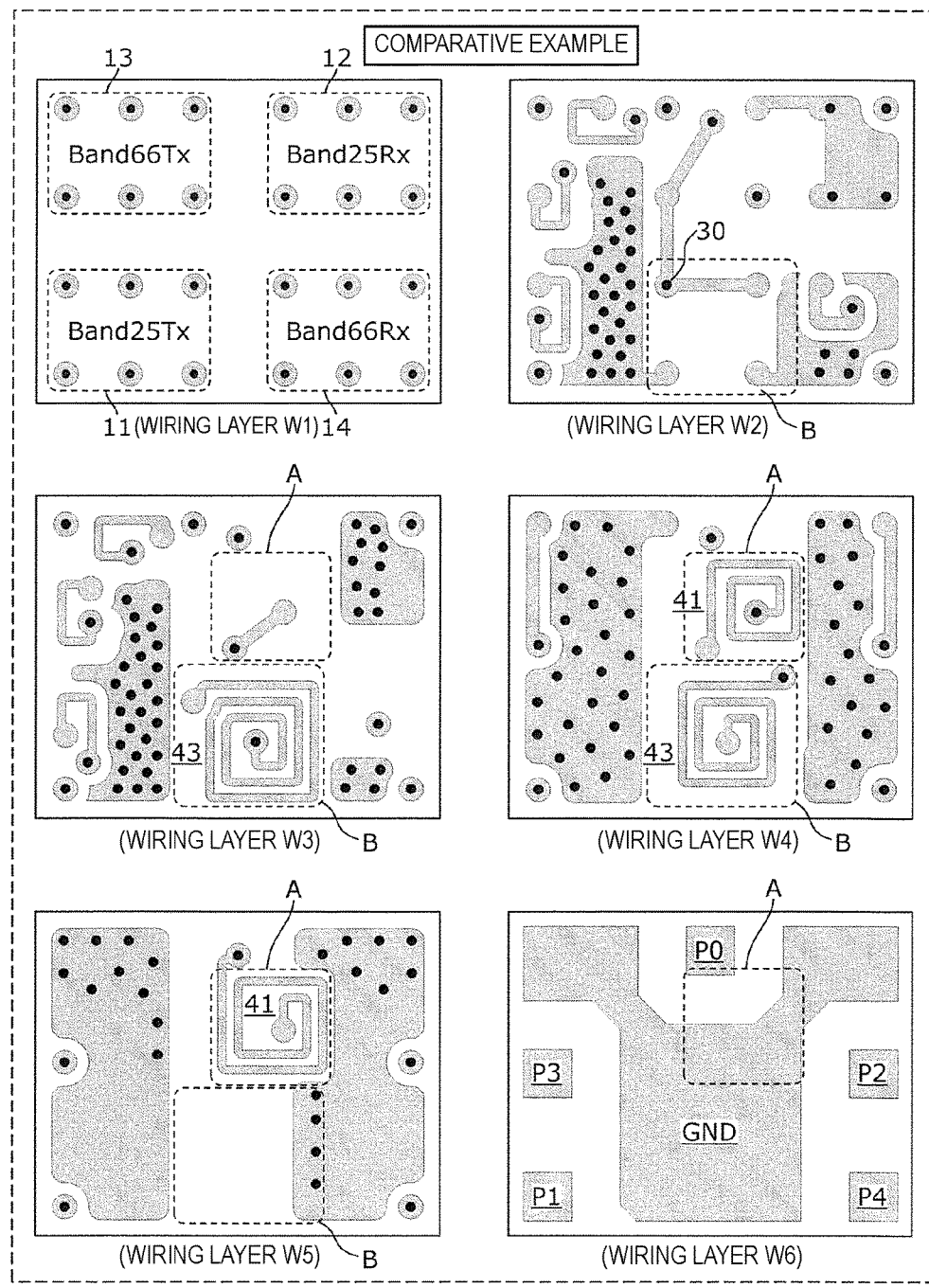
FIG. 15 is a plan view illustrating a comparative example of a wiring layout in a mounting substrate of the multiplexer according to the second preferred embodiment of the present invention.
Figure 16A:
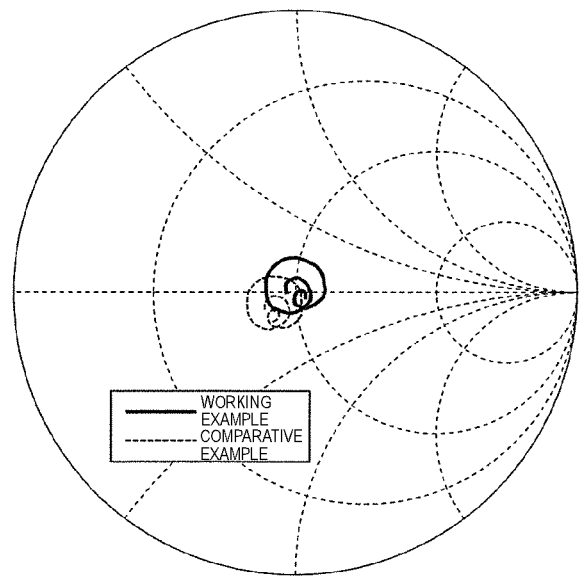
FIG. 16A is a Smith chart showing an example of a complex impedance seen from an antenna end of a transmission-side filter of Band 25 according to the second preferred embodiment of the present invention.
Figure 16B:
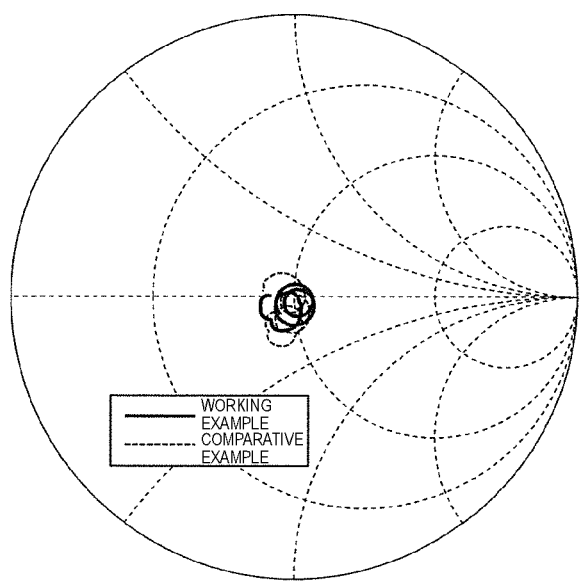
FIG. 16B is a Smith chart showing an example of a complex impedance seen from an antenna end of a reception-side filter of Band 25 according to the second preferred embodiment of the present invention.
Figure 16C:
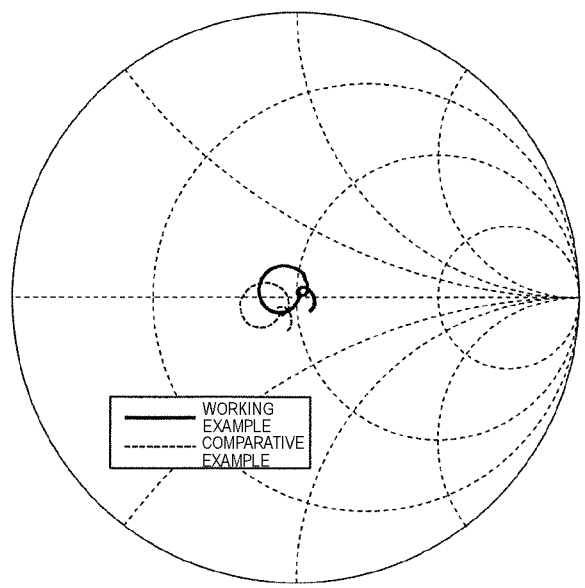
FIG. 16C is a Smith chart showing an example of a complex impedance seen from an antenna end of a transmission-side filter of Band 66 according to the second preferred embodiment of the present invention.
Figure 16D:
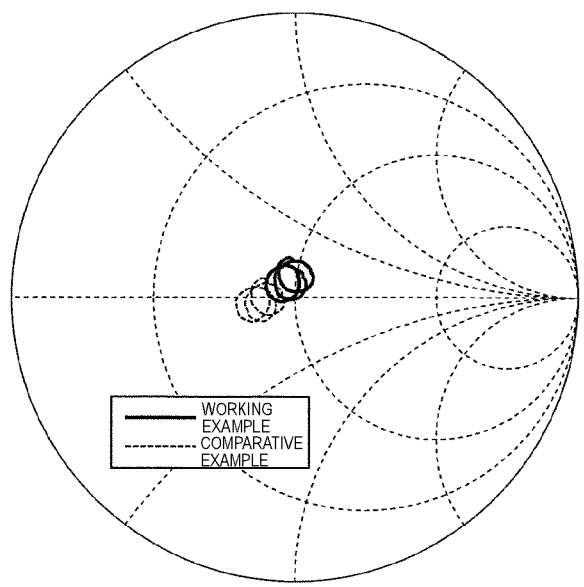
FIG. 16D is a Smith chart showing an example of a complex impedance seen from an antenna end of a reception-side filter of Band 66 according to the second preferred embodiment of the present invention.

FIG. 15 is a plan view illustrating the comparative example of the layout in the mounting substrate 60. In FIG. 15, an example of a layout of the connection electrodes 66 and 67, the in-plane conductor 68, and the interlayer conductor 69 that are disposed in the wiring layers W1 to W6 is illustrated.

The layout of the comparative example in FIG. 15 is different from the layout of the working example in FIG. 14 in the following points. The inductance element 41 is provided in the wiring layers W4 and W5, and the inductance element 43 is provided in the wiring layers W3 and W4. Further, a ground pattern is provided in a portion of the wiring layer W6, which is adjacent to the wiring layer W5, overlapping with a region A in which the inductance element 41 is provided in a plan view. The multiplexer configured in accordance with the layout of the comparative example cannot sufficiently exhibit the above-described advantageous effects due to these differences.

FIGS. 16A to 16D are Smith charts showing complex impedances of the filters 11 to 14 seen from the common signal terminal P0, where a solid line represents the working example and a dotted line represents the comparative example. As shown in FIGS. 16A to 16D, of the complex impedances of the filters, the complex impedances in the working example preferably agree with the characteristic impedance. However, variations are observed in the comparative example.

Figure 17:
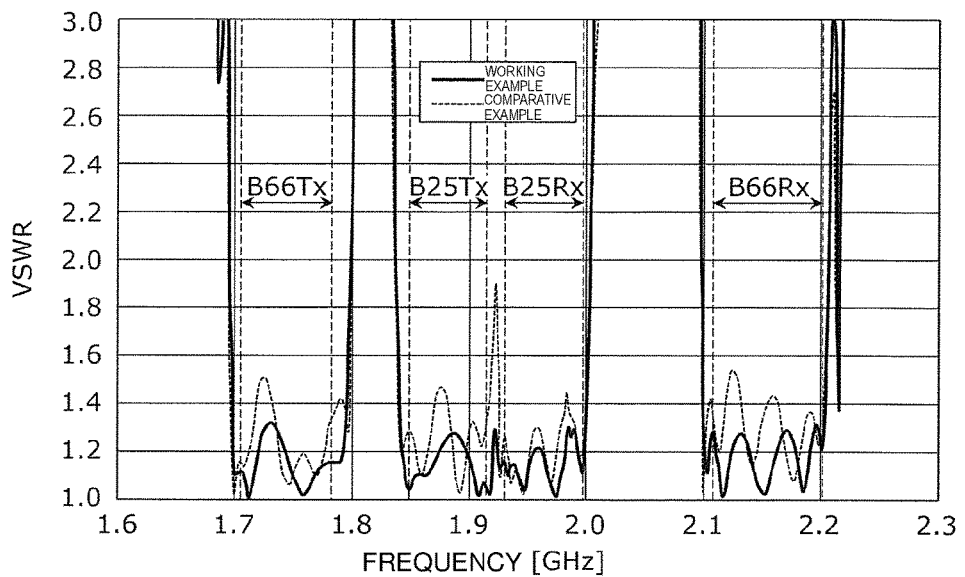
FIG. 17 is a graph showing an example of a VSWR of the multiplexer according to the second preferred embodiment of the present invention.

FIG. 17 is a graph showing VSWRs of the filters 11 to 14 seen from the common signal terminal P0, where a solid line represents the working example and a dotted line represents the comparative example. As shown in FIG. 17, the VSWRs of the filters 11 to 14 seen from the common signal terminal P0 are no more than about 1.30 in all if the frequency bands in the working example. However, a maximum value of around 1.47 to 1.53 is observed in each frequency band in the comparative example.

From the results of the simulation, it has been confirmed that the signal propagation characteristics are able to be improved in the working example based on the impedance matching with high precision in comparison with the case of the comparative example.

Figure 18A:
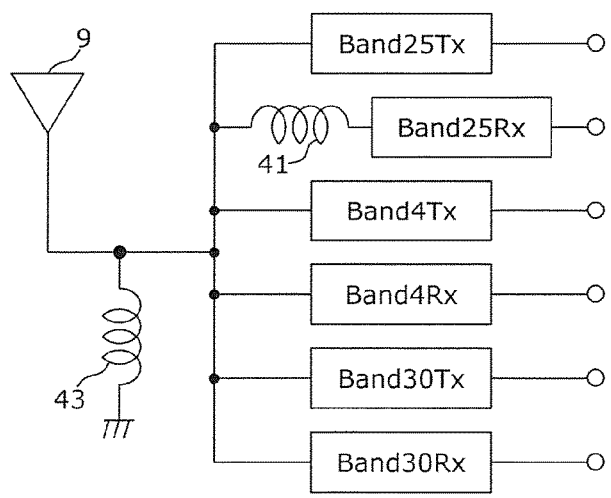
FIG. 18A is a block diagram illustrating an example of a functional configuration of a multiplexer according to a variation on the second preferred embodiment of the present invention.

The structure and advantageous effects according to a preferred embodiment of the multiplexer have been described using an example of the quadplexer applied to Band 25 and Band 66. However, the same or substantially the same advantageous effects are also able to be obtained by a quadplexer of another combination, such as a combination of Bands 1 and 3 or a combination of Bands 3 and 7, for example. Moreover, not being limited to the quadplexer, a multiplexer that achieves more accurate impedance matching is able to be obtained as a hexaplexer combining three bands as illustrated in FIGS. 18A and 18B, or other suitable multiplexers, for example.

Although the multiplexers, the transmission devices, and the reception devices according to preferred embodiments of the present invention have been described above with reference to the preferred embodiments, the present invention is not limited to the individual preferred embodiments. Various modifications and variations conceived by those skilled in the art may be performed on the preferred embodiments of the present invention, preferred embodiments defined by combining elements of different preferred embodiments, and other configurations may be included in the scope the present invention without departing from the spirit of the aspects of the present invention.

The features and aspects of the present invention may be widely used, as an elastic wave filter device that is small in size and has excellent insertion loss characteristics including a plurality of elastic wave filters, in a communication apparatus, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a mounting substrate;
   one first elastic wave filter and one or more second elastic wave filters that are provided on one principal surface of the mounting substrate and have different pass bands from each other; and
   a first inductance element provided in the mounting substrate, and one end of which is connected to one end of the first elastic wave filter; wherein
   another end of the first inductance element and one end of each of the one or more second elastic wave filters are connected to each other;
   the first elastic wave filter includes one or more first resonators defining a signal path connecting the one end and the another end of the first elastic wave filter and one or more second resonators connected between the signal path and a reference terminal, and at least one of the second resonators is connected between the one end of the first elastic wave filter and the first resonator closest to the one end of the first elastic wave filter in the signal path;
   each of the one or more second elastic wave filters includes one or more third resonators defining a signal path connecting the one end and the another end of the second elastic wave filter, and one or more fourth resonators connected between the signal path and a reference terminal;
   the mounting substrate is a multilayer substrate including wiring conductors that are disposed in or on a plurality of wiring layers that are provided at the one principal surface, at another principal surface, and in an inner layer of the mounting substrate;
   the first inductance element includes a first wiring conductor disposed in or on at least one of the plurality of wiring layers; and
   the plurality of wiring layers include a wiring layer which is adjacent, on the another principal surface side of the mounting substrate, to the wiring layer on which the first wiring conductor is disposed, and in which a ground pattern is not provided in a portion overlapping with a formation region of the first inductance element in a plan view.

2. The multiplexer according to claim 1, wherein the plurality of wiring layers include a wiring layer which is adjacent, on the one principal surface side of the mounting substrate, to the wiring layer on which the first wiring conductor is disposed, and in which a ground pattern is not provided in a portion overlapping with the formation region of the first inductance element in a plan view.

3. The multiplexer according to claim 1, further comprising:
   a common signal terminal provided in or on the mounting substrate; and
   a second inductance element provided in the mounting substrate and connected between the common signal terminal and a common connection point of the another end of the first inductance element and the one end of each of the one or more second elastic wave filters; wherein
   the second inductance element includes a second wiring conductor disposed in or on at least one of the plurality of wiring layers; and
   at least one of the wiring layers in or on which the second wiring conductor is disposed is closer to the another principal surface of the mounting substrate than any of the plurality of wiring layers in or on which the first wiring conductor is disposed.

4. The multiplexer according to claim 1, further comprising:
   a common signal terminal provided in or on the mounting substrate; and
   a second inductance element provided in the mounting substrate and connected between a reference terminal and a signal path connecting the common signal terminal and a common connection point of the another end of the first inductance element and the one end of each of the one or more second elastic wave filters; wherein
   the second inductance element includes a second wiring conductor disposed in or on at least one of the plurality of wiring layers; and
   at least one of the wiring layers in or on which the second wiring conductor is disposed is closer to the another principal surface of the mounting substrate than any of the plurality of wiring layers in or on which the first wiring conductor is disposed.

5. The multiplexer according to claim 3, further comprising:

a ground pattern provided on the another principal surface of the mounting substrate.

6. The multiplexer according to claim 1, wherein
each of the first, second, third, and fourth resonators includes a substrate and an interdigital transducer electrode disposed on the substrate;
the substrate is a multilayer body including a high acoustic velocity film, a low acoustic velocity film, and a piezoelectric film;
the high acoustic velocity film has an acoustic velocity of a bulk wave propagating therein that is larger than acoustic velocities of a surface acoustic wave and a boundary wave propagating in the piezoelectric film;
the low acoustic velocity film is provided on the high acoustic velocity film, and an acoustic velocity of a bulk wave propagating therein is smaller than the acoustic velocities of the surface acoustic wave and the boundary wave propagating in the piezoelectric film; and
the piezoelectric film is provided on the low acoustic velocity film.

7. A transmission device comprising:
the multiplexer according to claim 1; and
at least one transmission circuit connected to the multiplexer and generating a plurality of transmission signals having mutually different frequency bands; wherein
the multiplexer acquires the plurality of transmission signals from the at least one transmission circuit and combines the acquired transmission signals into a single antenna signal.

8. The transmission device according to claim 7, wherein the plurality of wiring layers include a wiring layer which is adjacent, on the one principal surface side of the mounting substrate, to the wiring layer on which the first wiring conductor is disposed, and in which a ground pattern is not provided in a portion overlapping with the formation region of the first inductance element in a plan view.

9. The transmission device according to claim 7, further comprising:
a common signal terminal provided in or on the mounting substrate; and
a second inductance element provided in the mounting substrate and connected between the common signal terminal and a common connection point of the another end of the first inductance element and the one end of each of the one or more second elastic wave filters; wherein
the second inductance element includes a second wiring conductor disposed in or on at least one of the plurality of wiring layers; and
at least one of the wiring layers in or on which the second wiring conductor is disposed is closer to the another principal surface of the mounting substrate than any of the plurality of wiring layers in or on which the first wiring conductor is disposed.

10. The transmission device according to claim 7, further comprising:
a common signal terminal provided in or on the mounting substrate; and
a second inductance element provided in the mounting substrate and connected between a reference terminal and a signal path connecting the common signal terminal and a common connection point of the another end of the first inductance element and the one end of each of the one or more second elastic wave filters; wherein the second inductance element includes a second wiring conductor disposed in or on at least one of the plurality of wiring layers; and
at least one of the wiring layers in or on which the second wiring conductor is disposed is closer to the another principal surface of the mounting substrate than any of the plurality of wiring layers in or on which the first wiring conductor is disposed.

11. The transmission device according to claim 9, further comprising:
a ground pattern provided on the another principal surface of the mounting substrate.

12. The transmission device according to claim 7, wherein
each of the first, second, third, and fourth resonators includes a substrate and an interdigital transducer electrode disposed on the substrate;
the substrate is a multilayer body including a high acoustic velocity film, a low acoustic velocity film, and a piezoelectric film;
the high acoustic velocity film has an acoustic velocity of a bulk wave propagating therein that is larger than acoustic velocities of a surface acoustic wave and a boundary wave propagating in the piezoelectric film;
the low acoustic velocity film is provided on the high acoustic velocity film, and an acoustic velocity of a bulk wave propagating therein is smaller than the acoustic velocities of the surface acoustic wave and the boundary wave propagating in the piezoelectric film; and
the piezoelectric film is provided on the low acoustic velocity film.

13. A reception device comprising:
the multiplexer according to claim 1; and
at least one reception circuit connected to the multiplexer and processing a plurality of reception signals having mutually different frequency bands; wherein
the multiplexer isolates the plurality of reception signals from a single antenna signal including the plurality of reception signals and supplies the isolated reception signals to the reception circuit or reception circuits.

14. The reception device according to claim 13, wherein the plurality of wiring layers include a wiring layer which is adjacent, on the one principal surface side of the mounting substrate, to the wiring layer on which the first wiring conductor is disposed, and in which a ground pattern is not provided in a portion overlapping with the formation region of the first inductance element in a plan view.

15. The reception device according to claim 13, further comprising:
a common signal terminal provided in or on the mounting substrate; and
a second inductance element provided in the mounting substrate and connected between the common signal terminal and a common connection point of the another end of the first inductance element and the one end of each of the one or more second elastic wave filters; wherein
the second inductance element includes a second wiring conductor disposed in or on at least one of the plurality of wiring layers; and
at least one of the wiring layers in or on which the second wiring conductor is disposed is closer to the another principal surface of the mounting substrate than any of the plurality of wiring layers in or on which the first wiring conductor is disposed.

16. The reception device according to claim 13, further comprising:

a common signal terminal provided in or on the mounting substrate; and a second inductance element provided in the mounting substrate and connected between a reference terminal and a signal path connecting the common signal terminal and a common connection point of the another end of the first inductance element and the one end of each of the one or more second elastic wave filters; wherein the second inductance element includes a second wiring conductor disposed in or on at least one of the plurality of wiring layers; and at least one of the wiring layers in or on which the second wiring conductor is disposed is closer to the another principal surface of the mounting substrate than any of the plurality of wiring layers in or on which the first wiring conductor is disposed.

17. The reception device according to claim 15, further comprising:

a ground pattern provided on the another principal surface of the mounting substrate.

18. The reception device according to claim 13, wherein each of the first, second, third, and fourth resonators includes a substrate and an interdigital transducer electrode disposed on the substrate;

the substrate is a multilayer body including a high acoustic velocity film, a low acoustic velocity film, and a piezoelectric film;

the high acoustic velocity film has an acoustic velocity of a bulk wave propagating therein that is larger than acoustic velocities of a surface acoustic wave and a boundary wave propagating in the piezoelectric film;

the low acoustic velocity film is provided on the high acoustic velocity film, and an acoustic velocity of a bulk wave propagating therein is smaller than the acoustic velocities of the surface acoustic wave and the boundary wave propagating in the piezoelectric film; and the piezoelectric film is provided on the low acoustic velocity film.

* * * * *